United States Patent
Philliber

(10) Patent No.: US 7,566,583 B2
(45) Date of Patent: Jul. 28, 2009

(54) METHOD OF DETERMINING ADHESION QUALITY

(75) Inventor: Joel A. Philliber, Fort Collins, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 35 days.

(21) Appl. No.: 11/855,086

(22) Filed: Sep. 13, 2007

(65) Prior Publication Data

US 2008/0000060 A1 Jan. 3, 2008

Related U.S. Application Data

(62) Division of application No. 11/049,116, filed on Jan. 31, 2005, now Pat. No. 7,304,412.

(51) Int. Cl.
*H01L 41/083* (2006.01)
*H01L 41/04* (2006.01)
*H01L 41/08* (2006.01)

(52) U.S. Cl. ............... 438/53; 310/324; 257/416

(58) Field of Classification Search ............ 438/48, 438/50, 53; 257/414, 416; 310/320, 324, 310/313 A, 313 R; 29/25.35
See application file for complete search history.

(56) References Cited

U.S. PATENT DOCUMENTS

| | | | | |
|---|---|---|---|---|
| 6,794,958 B2 * | 9/2004 | Philliber et al. | ............ | 333/189 |
| 6,894,360 B2 * | 5/2005 | Bradley | ............ | 257/458 |
| 7,027,202 B1 * | 4/2006 | Hunter et al. | ............ | 359/291 |
| 7,094,621 B2 * | 8/2006 | Blanchard | ............ | 438/48 |
| 7,094,678 B2 * | 8/2006 | Bradley | ............ | 438/612 |
| 7,140,084 B2 * | 11/2006 | Yamada et al. | ............ | 29/25.35 |
| 7,205,702 B2 * | 4/2007 | Ha et al. | ............ | 310/320 |
| 7,301,260 B2 * | 11/2007 | Kawakubo | ............ | 310/324 |
| 7,304,412 B2 * | 12/2007 | Philliber | ............ | 310/324 |
| 7,382,078 B2 * | 6/2008 | Bradley | ............ | 310/320 |
| 7,456,041 B2 * | 11/2008 | Ha et al. | ............ | 438/50 |
| 2002/0131458 A1 * | 9/2002 | Sirbu et al. | ............ | 372/20 |
| 2004/0017271 A1 * | 1/2004 | Philliber et al. | ............ | 333/187 |
| 2004/0021400 A1 | 2/2004 | Bradley et al. | | |
| 2004/0061619 A1 | 4/2004 | Kim et al. | | |
| 2005/0035828 A1 | 2/2005 | Kyoung et al. | | |
| 2006/0166393 A1 * | 7/2006 | Ha et al. | ............ | 438/53 |
| 2006/0170309 A1 * | 8/2006 | Philliber | ............ | 310/324 |
| 2006/0270090 A1 * | 11/2006 | Bradley | ............ | 438/48 |
| 2007/0052046 A1 | 3/2007 | Chu et al. | | |
| 2007/0113661 A1 | 5/2007 | Benzel et al. | | |
| 2007/0120625 A1 * | 5/2007 | Larson et al. | ............ | 333/189 |
| 2008/0000060 A1 * | 1/2008 | Philliber | ............ | 29/25.35 |
| 2008/0072408 A1 * | 3/2008 | Sano et al. | ............ | 29/25.35 |
| 2008/0074005 A1 * | 3/2008 | Sano et al. | ............ | 310/363 |

* cited by examiner

*Primary Examiner*—M. Wilczewski

(57) ABSTRACT

A method of determining adhesion quality and apparatus embodying the method are disclosed. The apparatus includes a substrate, a seed layer, and a resonator. The substrate defines a cavity and has a doped portion proximal to the cavity. The seed layer is disposed above the cavity. The resonator includes a bottom electrode on the seed layer, a piezoelectric portion on the bottom electrode, and a top electrode on the piezoelectric portion. To test the quality of adhesion of the seed layer to the substrate, one or more electrical property is measured between the doped portion and the bottom electrode and compared to a threshold value.

5 Claims, 5 Drawing Sheets

METHOD OF DETERMINING ADHESION QUALITY

CROSS-REFERENCE TO RELATED APPLICATIONS

This is a divisional application of application Ser. No. 11/049,116 of Joel A. Philliber, filed Jan. 31, 2005 now U.S. Pat. No. 7,304,412, for METHOD OF DETERMINING ADHESION QUALITY AND APPARATUS EMBODYING THE METHOD, the entire disclosure of which is hereby incorporated by reference herein.

BACKGROUND

The present invention relates to acoustic resonators, and more particularly, to resonators that may be used as filters for electronic circuits.

The need to reduce the cost and size of electronic equipment has led to a continuing need for ever-smaller electronic filter elements. Consumer electronics such as cellular telephones and miniature radios place severe limitations on both the size and cost of the components contained therein. Further, many such devices utilize electronic filters that must be tuned to precise frequencies. Filters select those frequency components of electrical signals that lie within a desired frequency range to pass while eliminating or attenuating those frequency components that lie outside the desired frequency range.

One class of electronic filters that has the potential for meeting these needs is constructed from thin film bulk acoustic resonators (FBARS). These devices use bulk longitudinal acoustic waves in thin film piezoelectric (PZ) material. In one simple configuration, a layer of PZ material is sandwiched between two metal electrodes. The sandwich structure can be suspended in air. A sample configuration of an apparatus 10 having a resonator 12 (for example, an FBAR) is illustrated in FIGS. 1A and 1B. FIG. 1A illustrates a top view of the apparatus 10 while FIG. 1B illustrates a side view of the apparatus 10 along line 1B-1B of FIG. 1A. The resonator 12 is fabricated above a substrate 14. Deposited and etched on the substrate 14 are, in order, a bottom electrode layer 15, piezoelectric layer 17, and a top electrode layer 19. Portions (as indicated by bracket 12) of these layers—15, 17, and 19—that overlap and are fabricated over a cavity 22 constitute the resonator 12. These portions are referred to as a bottom electrode 16, piezoelectric portion 18, and a top electrode 20. In the resonator 12, the bottom electrode 16 and the top electrode 20 sandwiches the PZ portion 18. The electrodes 16 and 20 are conductors while the PZ portion 18 is typically crystal such as Aluminum Nitride (AlN).

When electric field is applied between the metal electrodes 16 and 20, the PZ portion 18 converts some of the electrical energy into mechanical energy in the form of mechanical waves. The mechanical waves propagate in the same direction as the electric field and reflect off of the electrode/air interface.

Resonators for applications in the GHz range may be constructed with physical dimensions on the order of less than 100 micrometers in lateral extent and a few micrometers in total thickness. In implementation, for example, the resonator 12 is fabricated using known semiconductor fabrication processes and is combined with electronic components and other resonators to form electronic filters for electrical signals.

During fabrication, in some instances, the resonator 12 delaminates from the substrate 14 resulting in an undesirable configuration. Such delamination, when found, is often found proximal to edges of the cavity 22 between the substrate 14 and the bottom electrode layer 15. To determine whether or not the resonator 12 is delaminated from the substrate 14, the apparatus 10 is cut along line 1B-1B to expose its cross section. Then, the cross section is examined. However, even if delamination is discovered during the examination, it is difficult to determine whether the detected delamination occurred during the fabrication process or during the cutting step to expose its cross section. Further, the cutting step destroys the apparatus 10 rendering it useless.

Consequently, there remains a need for a better method to determine whether or not delamination has occurred between a substrate and a resonator on the substrate.

SUMMARY

The need is met by the present invention. In a first embodiment of the present invention, an apparatus includes a substrate, a seed layer, and a resonator. The substrate defines a cavity and has a doped portion proximal to the cavity. The seed layer is disposed above the cavity. The resonator includes a bottom electrode on the seed layer, a piezoelectric portion on the bottom electrode, and a top electrode on the piezoelectric portion.

In a second embodiment of the present invention, a method of testing an apparatus is disclosed, the apparatus including a substrate and a resonator fabricated on the substrate. Value of an electrical property is measured between a doped portion of the substrate and an electrode layer of the resonator. Then, the measured value is compared to a threshold value.

In a third embodiment of the present invention, a method of fabricating an apparatus is disclosed. A substrate is provided. A cavity is formed within the substrate. A portion of the substrate is doped, the portion being proximal to the cavity. A seed layer is fabricated on the substrate. A resonator is fabricated on the seed layer, the resonator having a bottom electrode and a top electrode sandwiching a piezoelectric portion.

Other aspects and advantages of the present invention will become apparent from the following detailed description, taken in conjunction with the accompanying drawings, illustrating by way of example the principles of the invention.

DETAILED DESCRIPTION

The present invention will now be described with reference to the Figures which illustrate various embodiments of the present invention. In the Figures, some sizes of structures or portions may be exaggerated and not to scale relative to sizes of other structures or portions for illustrative purposes and, thus, are provided to illustrate the general structures of the present invention. Furthermore, various aspects of the present invention are described with reference to a structure or a portion positioned "on" or "above" relative to other structures, portions, or both. Relative terms and phrases such as, for example, "on" or "above" are used herein to describe one structure's or portion's relationship to another structure or portion as illustrated in the Figures. It will be understood that such relative terms are intended to encompass different orientations of the device in addition to the orientation depicted in the Figures. For example, if the device in the Figures is turned over, rotated, or both, the structure or the portion described as "on" or "above" other structures or portions would now be oriented "below," "under," "left of," "right of," "in front of," or "behind" the other structures or portions. References to a structure or a portion being formed "on" or "above" another structure or portion contemplate that additional structures or portions may intervene. References to a structure or a portion being formed on or above another structure or portion without an intervening structure or portion are described herein as being formed "directly on" or "directly above" the other structure or the other portion. The same reference number refers to the same elements throughout this document.

As shown in the Figures for the purposes of illustration, embodiments of the present invention are exemplified by an apparatus including a substrate, a seed layer on the substrate, and a resonator on the seed layer. The substrate defines a cavity and includes a doped portion proximal to the cavity 34. The resonator includes a bottom electrode and a top electrode sandwiching a piezoelectric portion.

In this configuration, lamination or delamination of the seed layer from the substrate can be determined by measuring the value of an electrical property between the doped portion of the substrate and the bottom electrode of the resonator then comparing the measured value to a threshold value. Thus, the apparatus is not destroyed during the determination process. Further, if delamination is discovered, it can be attributed to the fabrication process since the apparatus remains intact.

Figure 2A:
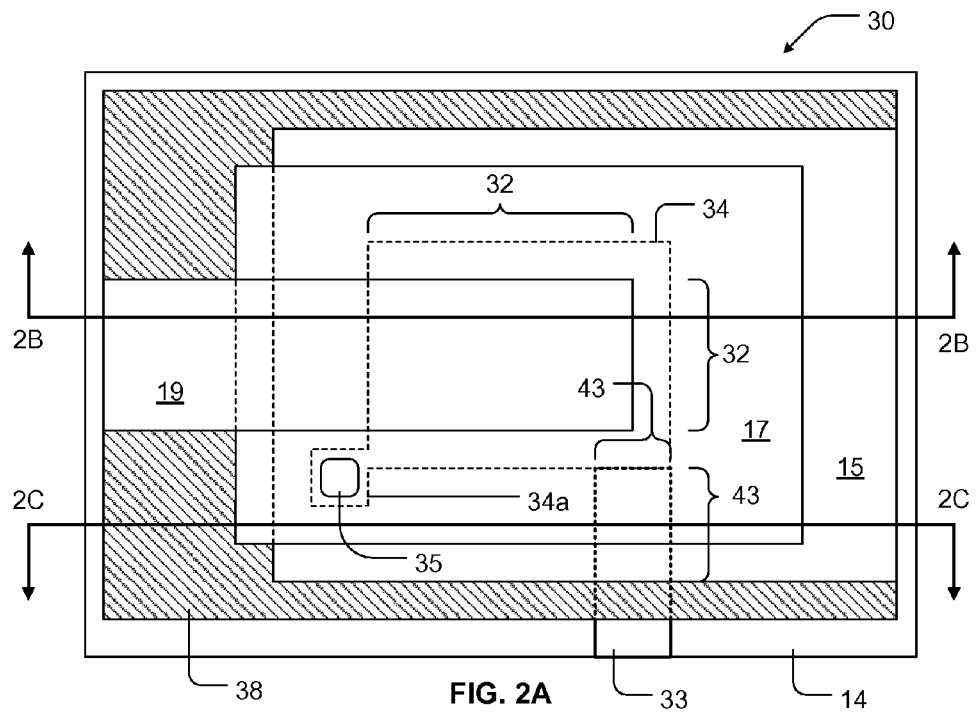
FIG. 2A is a top view of an apparatus according to a first embodiment of the present invention.
Figure 2B:
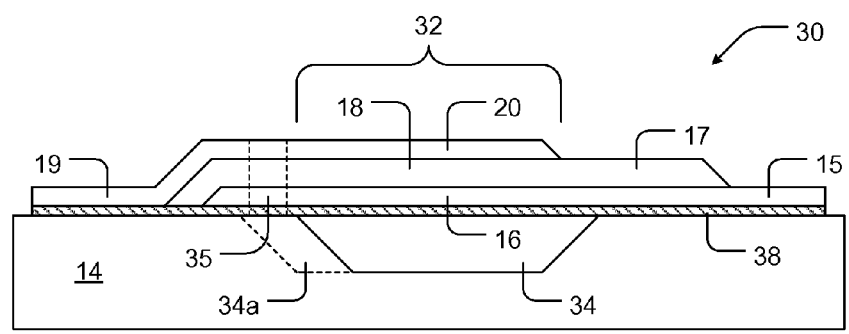
FIG. 2B is a cutaway side view of the apparatus of FIG. 2A cut along line 2B-2B.
Figure 2C:
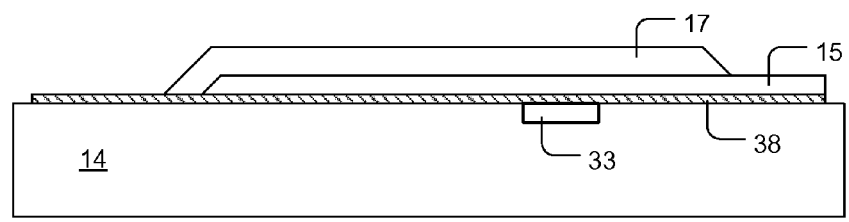
FIG. 2C is a cutaway side view of the apparatus of FIG. 2A cut along line 2C-2C.

FIG. 2A illustrates a top view of an apparatus 30 according to a one embodiment of the present invention. FIG. 2B is a cutaway side view of the apparatus 30 of FIG. 2A cut along line 2B-2B. FIG. 2C is a cutaway side view of the apparatus 30 of FIG. 2A cut along line 2C-2C.

Figure 1A:
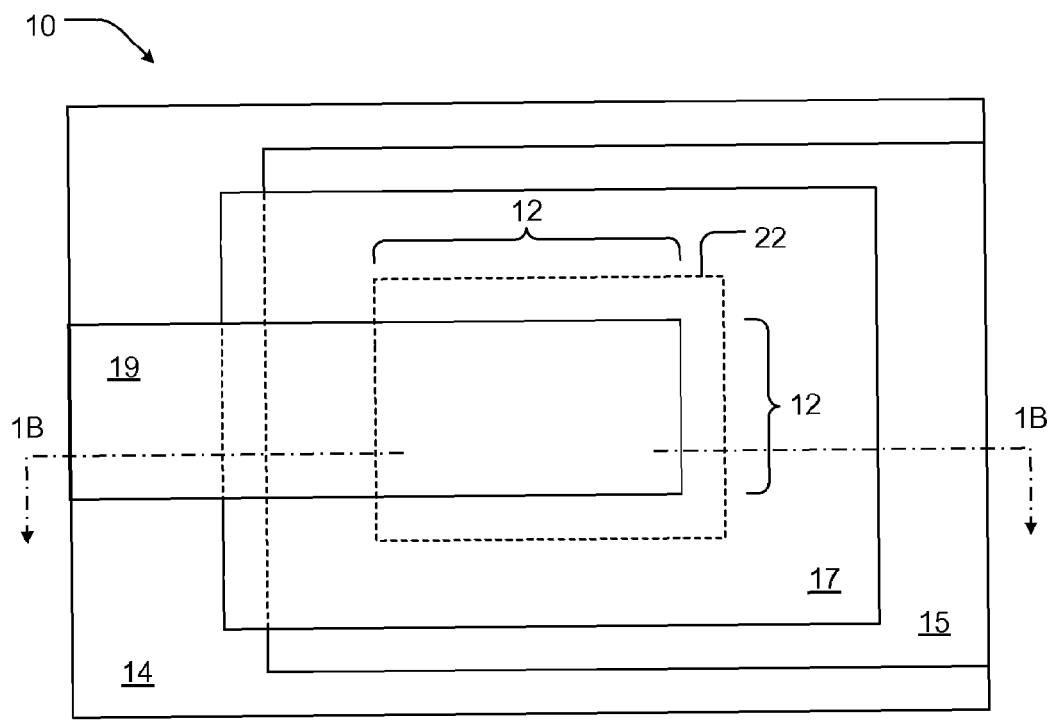
FIG. 1A is a top view of an apparatus including a resonator known in prior art.
Figure 1B:
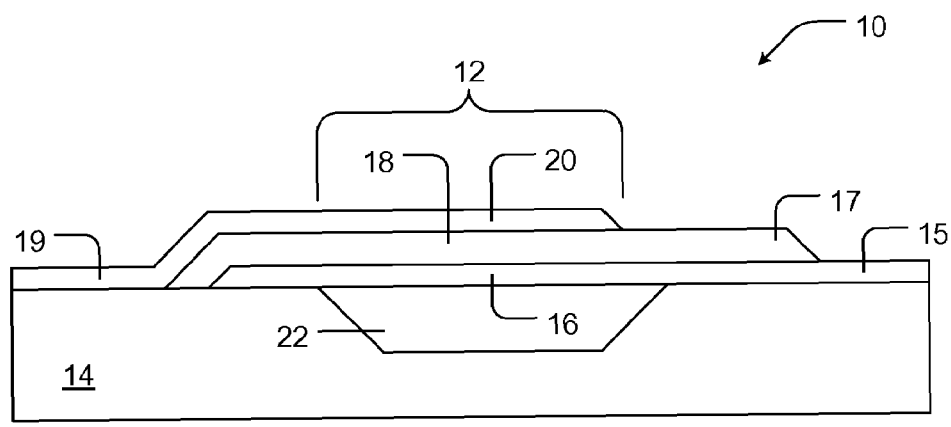
FIG. 1B is a cutaway side view of the apparatus of FIG. 1A cut along line 1B-1B.

Portions of the apparatus 30 are similar to corresponding portions of the apparatus 10 of FIGS. 1A and 1B. For convenience, portions of the apparatus 30 in FIGS. 2A through 2C that are similar to portions of the apparatus 10 of FIGS. 1A and 1B are assigned the same reference numerals. Referring to FIGS. 2A through 2C, the apparatus 30 according to the illustrated embodiment of the present invention includes a resonator 32 fabricated on a substrate 14.

Figure 3:
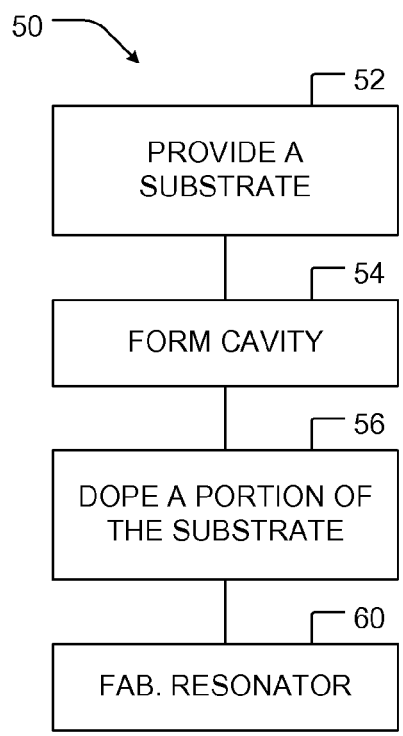
FIG. 3 is a flowchart illustrating a second embodiment of the present invention.

FIG. 3 is a flowchart 50 illustrating the steps to form the apparatus 30 in accordance with another embodiment of the present invention. Referring to FIG. 3 and to FIGS. 2A through 2C, to fabricate the apparatus 30, a substrate 14 is provided. Step 52. A cavity 34 is formed within the substrate. Step 54. To form the cavity 34, the substrate 14 is etched and filled with suitable sacrificial material such as, for example, phosphosilicate glass (PSG).

A portion 33 of the substrate 14 is doped to create a doped portion 33 of the substrate 14 having higher level of electrical conductance (thus lower level of electrical resistance) than the substrate 14. Step 56. The doped portion 33 can be doped with p-type dopants such as, for example, Boron, Aluminum, or Gallium. Alternatively, the doped portion 33 can be doped with n-type dopants such as, for example, Phosphorus, Arsenic, or Antimony.

The concentration of dopants within the doped portion 33 depends on the desired electrical property of the doped portion 33. In the illustrated embodiment, in order to make the electrical connection by doping the silicon substrate 14, the doped portion 33 is doped with Phosphorus for n-type doping within a range of $1e10$ $cm^2$ to $1e20$ $cm^2$, for example, to approximately $8e13$ $cm^2$. As the doping level increases, the resistance of the doped portion 33 decreases. This resulted in the doped portion 33 having a resistance in the range of 100 to 400 ohms.

To achieve this level of doping, implant energy of 100 keV were applied to obtain a junction depth (thickness) of approximately one micrometer. In the illustrated embodiment, the doped portion 33 has lateral dimensions of approximately 10 micrometers on a side. Of course, other electrical properties (for example, lower resistance within the doped portion 33) can be achieved by varying the doping concentration, dimensions of the doped portion 33, or both.

Then, the substrate 14, now including the filled cavity 34 is planarized using known methods such as chemical mechanical polishing. The cavity 34 can include an evacuation tunnel portion 34a aligned with an evacuation via 35 through which the sacrificial material is later evacuated.

Next, a thin seed layer 38 is optionally fabricated on the planarized substrate 14 between the substrate 14 and the bottom electrode layer 15. Typically the seed layer 38 is sputtered on the planarized substrate 14. The seed layer 38 can be fabricated using Aluminum Nitride (AlN) or other similar crystalline material, for example, Aluminum Oxynitride (ALON), Silicon Dioxide ($SiO_2$), Silicon Nitride ($Si_3N_4$), or Silicon Carbide (SiC). In the illustrated embodiment, thickness of the seed layer 38 can range from approximately 10 Angstroms (or one nanometer) to approximately 10,000 Angstroms (or one micrometer) thick. Known sputtering techniques can be used to fabricate the seed layer 38.

Then, above the seed layer 38, the resonator 32 is fabricated, the resonator comprising a bottom electrode 16 and a top electrode 20 sandwiching a piezoelectric (PZ) portion 18. Step 60. To fabricate the resonator 32, the following layers are fabricated: a bottom electrode layer 15, a piezoelectric layer 17, and a top electrode layer 19. Portions (as indicated by bracket 32) of these layers—15, 17, and 19—that overlap and are situated above the cavity 34 constitute the resonator 32. These portions are referred to as the bottom electrode 16, the piezoelectric portion 18, and the top electrode 20. The bottom electrode 16 and the top electrode 20 sandwiches the PZ portion 18. The sacrificial material is removed from the cavity 34 following the fabrication of the resonator 32.

The electrodes 16 and 20 are conductors such as Molybdenum and, in the illustrated embodiment, have thickness in a range from approximately 0.3 micrometer to approximately 0.5 micrometer. The PZ portion 18 is typically made from crystalline material such as Aluminum Nitride (AlN), and, in the illustrated embodiment, has thickness in a range from approximately 0.5 micrometer to 1.0 micrometer. The thickness of the various layers of the resonator 32 as well as lateral dimensions of the resonator 32 can vary widely depending on the desired application.

For example, the lateral dimensions of the resonator 32 can range from approximately 100 micrometers to over 100 micrometers. Of course, these measurements can vary widely depending on a number of factors such as, without limitation, the desired resonant frequency, materials used, the fabrication process used, etc. The illustrated resonator 32 having these measurements can be useful in filters in the neighborhood of 1.92 GHz. Of course, the present invention is not limited to these sizes or frequency ranges. The seed layer 38 provides for a better underlayer on which the resonator 32 is fabricated.

Figure 4:
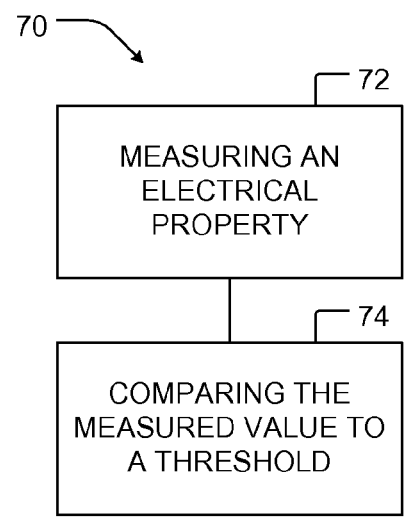
FIG. 4 is a flowchart illustrating a third embodiment of the present invention.

FIG. 4 is a flowchart 70 illustrating a method of testing the apparatus 32 (of FIG. 2A). Referring to FIG. 4 and to FIGS. 2A through 2C, once fabricated, the apparatus 30 can be tested for delamination of the seed layer 38 from the substrate 14 by measuring the value of an electrical property between the doped portion 33 and the bottom electrode layer 15 (a portion of which form the bottom electrode 16 of the resonator 32), Step 72, then comparing the measured value to a threshold value to ascertain whether the measured value indicates delamination of the seed layer 38 from the substrate 14, Step 74.

For example, capacitance between the doped portion 33 and the bottom electrode layer 15 can be measured. When there is no delamination of the seed layer 38 from the resonator, the capacitance between the doped portion 33 and the bottom electrode layer 15 is determined by various factors such as, for example only, the piezoelectric material of the seed layer 38, size of the area of contact between the doped portion 33 and the seed layer 38, and thickness of the seed layer 38. In FIG. 2A, the contact area is indicated by brackets reference numeral 43.

20 micrometers lengthwise overlapped with the bottom electrode 16), the capacitance is approximately 3.72 picoFarads when the seed layer 38 is laminated to the substrate 14 with no delamination. This is the capacitance value expected from the apparatus 10 if delamination does not exist and is referred herein to as the base capacitance value.

To test for delamination of the seed layer 38 from the substrate 14, capacitance between the doped portion 33 and the bottom electrode layer 15 is measured. Then, the measured capacitance value is compared to a threshold capacitance. In the present example, the threshold capacitance can be set near 3.72 picoFarads plus some tolerance value.

Figure 5:
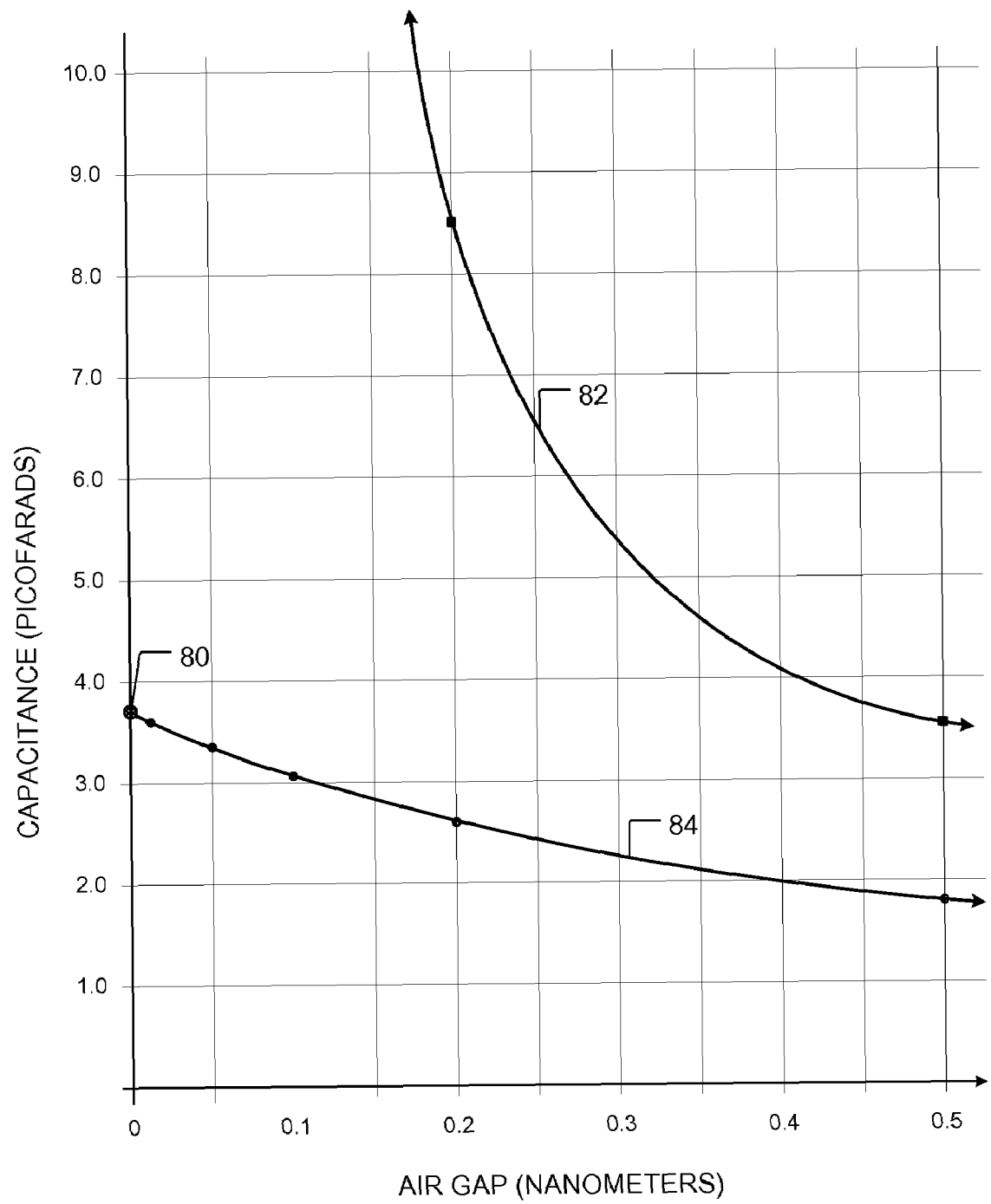
FIG. 5 is a graph illustrating an aspect of the present invention.

FIG. 5 illustrates various measured capacitance values depending on the degree of delamination. Referring to FIGS. 2A through 2C and 5, reference numeral 80 indicates the base value of approximately 3.72 picoFarads that can be measured if no delamination exists. If the seed layer 38 delaminates from the substrate 14, air is introduced between the seed layer 38 and the substrate 14. An air-capacitance curve 82 illustrates the capacitance between the doped portion 33 and the bottom electrode layer 15 introduced by air between the seed layer 38 and the substrate 14 within the illustrated range of delamination gap. A combined-capacitance curve 84 illustrates the capacitance between the doped portion 33 and the bottom electrode layer 15 when the base capacitance value is combined with the air-capacitance curve.

As illustrated by the combined-capacitance curve 84, the capacitance between the doped portion 33 and the bottom electrode layer 15 drops significantly even with slight delamination of the seed layer 38 from the substrate 14. TABLE 1 below lists the values of the air-capacitance curve 82 and the combined-capacitance curve 84 in a list format for AlN seed layers having varying thicknesses.

TABLE 1

| Seed Layer Thickness, in nanometers | Base Capacitance, in picoFarads | Delamination Gap (Air thickness), in nanometers | Air Capacitance, in picoFarads | Combined Capacitance, in picoFarads | Percent Change from Base Capacitance |
|---|---|---|---|---|---|
| 5 nanometers | 3.71876 picoFarads | 0.01 | 177 | 3.64228 | 2.056807 |
| | | 0.05 | 35.4 | 3.3654 | 9.502262 |
| | | 0.1 | 17.7 | 3.07336 | 17.35537 |
| | | 0.2 | 8.85 | 2.61885 | 29.57746 |
| | | 0.5 | 3.54 | 1.81403 | 51.21951 |
| | | 1.0 | 1.7 | 1.1996 | 67.74194 |
| 10 nanometers | 1.8538 picoFarads | 0.01 | 177 | 1.84006 | 1.03909 |
| | | 0.05 | 35.4 | 1.76663 | 4.988124 |
| | | 0.1 | 17.7 | 1.6827 | 9.502262 |
| | | 0.2 | 8.85 | 1.53668 | 17.35537 |
| | | 0.5 | 3.54 | 1.21927 | 34.42623 |
| | | 1.0 | 1.7 | 0.907016 | 51.21951 |
| 20 nanometers | 0.929691 picoFarads | 0.01 | 177 | 0.924836 | 0.522258 |
| | | 0.05 | 35.4 | 0.905911 | 2.557856 |
| | | 0.1 | 17.7 | 0.883317 | 4.988124 |
| | | 0.2 | 8.85 | 0.736389 | 9.502262 |
| | | 0.5 | 3.54 | 0.609633 | 20.79208 |
| 30 nanometers | 0.619794 picoFarads | 0.01 | 177 | 0.617632 | 34.42623 |
| | | 0.05 | 35.4 | 0.609134 | 0.348779 |
| | | 0.1 | 17.7 | 0.598835 | 1.719902 |
| | | 0.2 | 8.85 | 0.579247 | 3.381643 |
| | | 0.5 | 3.54 | 0.527484 | 6.542056 |
| | | 1.0 | 1.7 | 0.459107 | 14.89362 |

In the illustrated embodiment, for the AlN seed layer 38 having thickness of five nanometers and contact area of approximately 200 square micrometers (for example, approximately ten micrometers wide line with approximately For example, for a five nanometers thick seed layer 38, even a 0.01 nanometer delamination can be detected by setting the threshold capacitance value at approximately 3.65 picoFarads. That is, if the capacitance between the doped portion 33 and the bottom electrode layer 15 is below 3.65 picoFarads, then the delamination is deemed to exist.

Alternative or in addition to measuring capacitance between the doped portion 33 and the bottom electrode layer 15, resistance can be measured to ascertain whether delamination has taken place between the seed layer 38 and the substrate 14. In general, AlN has resistivity of approximately 1e10 ohm per meter.

For the resistivity, a 5 nanometer thick layer of AlN with contact area 43 of approximately 200 square angstroms with the doped portion 33 has resistance of approximately 250 Giga ohms. Adding approximately 200 ohms of resistance of the doped portion 33 results in a negligible change in the base resistance of between the doped portion 33 and the bottom electrode layer 15.

Delamination of the seed layer 38 from the substrate 14 introduces air gap and increases resistance between the doped portion 33 and the bottom electrode layer 15. In fact, even a slight delamination results in a significant increase in the resistance between the doped portion 33 and the bottom electrode layer 15. By setting an appropriate threshold resistance value, even slight delamination can be detected.

TABLE 2 below lists approximately resistive value of the doped portion 30 and laminated the AlN layer 38 at various thickness of the seed layer 38. These values can be used as the base resistive value.

TABLE 2

| Seed Layer Thickness, in nanometers | Contact Area, in square micrometers | Laminated seed layer resistance, in Giga ohms |
| --- | --- | --- |
| 5 | 200 | 250 |
| 10 | | 500 |
| 20 | | 1,000 |
| 30 | | 1,500 |

In another alternative embodiment of the present invention, impedance between the doped portion 33 and the bottom electrode layer 15 is used to determine whether or not delamination exists between the seed layer 38 and the substrate 14. The impedance is a combined value of the capacitance and the resistance between the doped portion 33 and the bottom electrode layer 15.

Figure 6A:
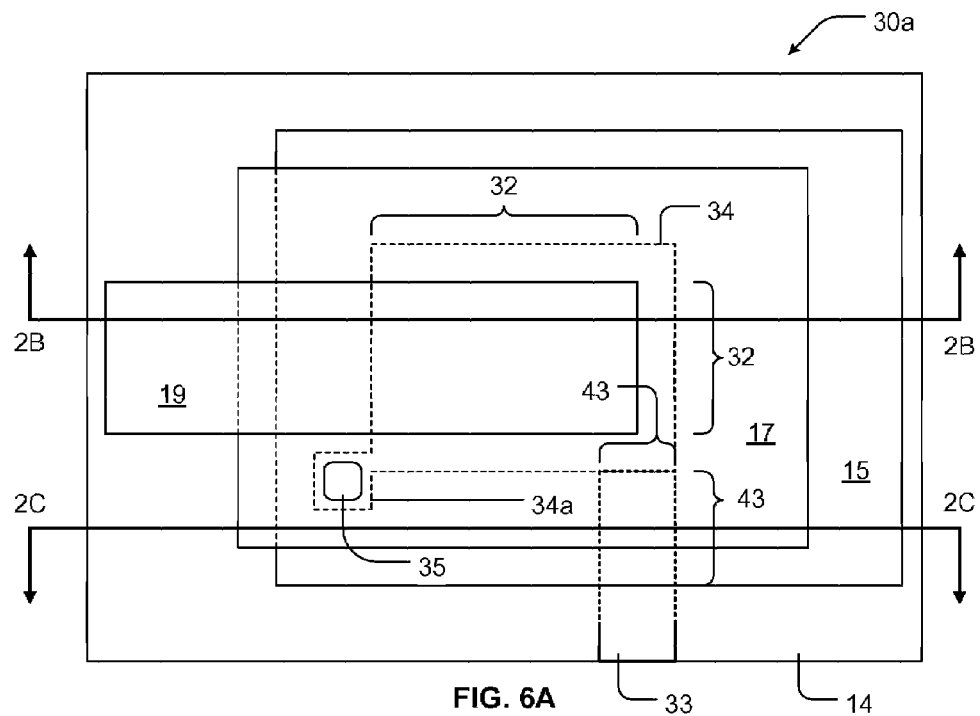
FIG. 6A is a top view of an apparatus according to a another embodiment of the present invention.
Figure 6B:
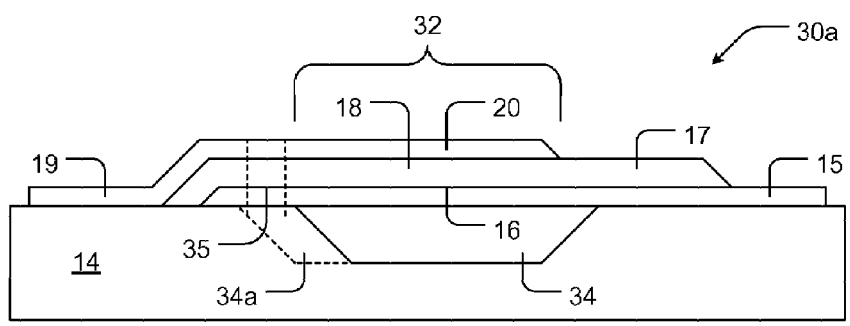
FIG. 6B is a cutaway side view of the apparatus of FIG. 6A cut along line 2B-2B.
Figure 6C:
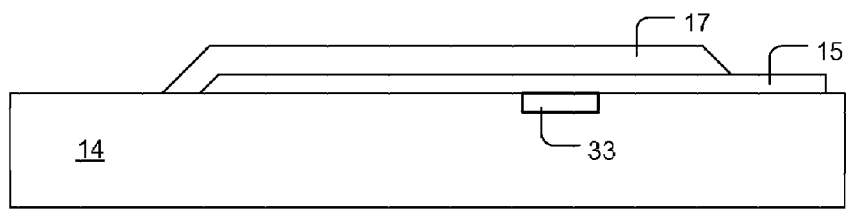
FIG. 6C is a cutaway side view of the apparatus of FIG. 6A cut along line 2C-2C.

Depending on implementation or application, different electrical property can be used for the determination of delamination of the resonator 32 from the substrate 14. For example, FIGS. 6A through 6C illustrate an apparatus 30a having same configuration as the apparatus 20 of FIGS. 2A through 2C but for the seed layer 38. The apparatus 30a of FIGS. 6A through 6C include portions similar to corresponding portions of the apparatus 30 of FIGS. 2A through 2C. Portions of the apparatus 30a of FIGS. 6A through 6C that are similar to corresponding portions of the apparatus 30 of FIGS. 2A through 2C are designated with the same reference numerals. The apparatus 30a of FIGS. 6A through 6C lacks the seed layer 38 present in the apparatus 30 of FIGS. 2A through 2C.

For the apparatus 30 of FIGS. 2A through 2C, base resistivity is relatively high (in the order of hundreds of Giga ohms or more) mostly due to the electrical insulating properties of the seed layer 38. For this reason, for this embodiment, capacitance may be more preferred as the electrical property to be measured and used to determine delamination of the resonator 32 from the substrate 14 compared to the apparatus 30a of FIGS. 6A through 6C. In comparison, for the apparatus 30a of FIGS. 6A through 6C, base resistivity is relatively low (in the order of hundred or hundreds of ohms) mainly because the apparatus 30a lacks the electrical insulating seed layer 38. For this reason, for this embodiment, resistance may be more preferred as the electrical property to be measured and used to determine delamination of the resonator 32 from the substrate 14 compared to the apparatus 30 of FIGS. 2A through 2C.

From the foregoing, it will be apparent that the present invention is novel and offers advantages over the current art. Although specific embodiments of the invention are described and illustrated above, the invention is not to be limited to the specific forms or arrangements of parts so described and illustrated. For example, the resonator doped portion 33 can have alternative shapes, placements, or both such as completely surrounding the cavity 34. Further, differing configurations, sizes, or materials may be used for values portions of the apparatus 30 but still fall within the scope of the present invention. The invention is limited by the claims that follow.

What is claimed is:

1. A method of fabricating an apparatus, the method comprising:
   providing a substrate;
   forming a cavity within the substrate;
   doping a portion of the substrate proximal to the cavity; and
   fabricating a resonator over the substrate, the resonator comprising a bottom electrode and a top electrode sandwiching a piezoelectric portion.

2. The method recited in claim 1 further comprising fabricating a seed layer on the substrate.

3. The method recited in claim 1 wherein the doped portion has a thickness in the order of one or more micrometers.

4. The method recited in claim 1 wherein the doped portion has lateral dimensions in the order of ten or tens of micrometers.

5. The method recited in claim 1 wherein the step of forming the cavity comprises:
   etching the cavity within the substrate;
   filling the cavity with sacrificial material; and
   removing the sacrificial material following the step of fabricating the resonator.

* * * * *